United States Patent
Condamin et al.

(10) Patent No.: US 8,142,237 B2
(45) Date of Patent: Mar. 27, 2012

(54) DEVICE FOR MEASURING A CURRENT FLOWING IN A CABLE

(75) Inventors: Bruno Condamin, Pontoise (FR); Pascal Muis, Pontoise (FR); Ghislain Bages, Pontenay le Fleury (FR)

(73) Assignees: Johnson Controls Technology Company, Holland, MI (US); Kromberg & Schubert GmbH & Co. KG, Wuppertal (DE)

( * ) Notice: Subject to any disclaimer, the term of this patent is extended or adjusted under 35 U.S.C. 154(b) by 0 days.

(21) Appl. No.: 12/423,470

(22) Filed: Apr. 14, 2009

(65) Prior Publication Data

US 2010/0066351 A1    Mar. 18, 2010

Related U.S. Application Data

(63) Continuation of application No. 11/793,440, filed as application No. PCT/FR2005/003113 on Dec. 13, 2005, now abandoned.

(30) Foreign Application Priority Data

Dec. 20, 2004    (FR) .................................... 04 13593

(51) Int. Cl.
    *H01R 4/42* (2006.01)
(52) U.S. Cl. .................... 439/762; 324/117 R; 439/754; 439/913; 439/957
(58) Field of Classification Search .......... 439/761–763, 439/913, 754, 957; 320/105; 324/713, 117 R, 324/117 H; 340/636.13
    See application file for complete search history.

(56) References Cited

U.S. PATENT DOCUMENTS

| | | | |
|---|---|---|---|
| 3,166,650 A * | 1/1965 | Heidrich ................... 200/52 R |
| 4,572,878 A * | 2/1986 | Daugherty .................. 429/62 |
| 4,584,525 A | 4/1986 | Hannden et al. |
| 4,629,979 A | 12/1986 | Missout et al. |
| 4,661,807 A * | 4/1987 | Panaro ........................ 340/638 |
| 4,675,255 A * | 6/1987 | Pfeifer et al. ................. 429/92 |
| 5,027,059 A | 6/1991 | De Montgolfier et al. |
| 5,214,407 A | 5/1993 | McKim, Jr. et al. |
| 5,877,563 A * | 3/1999 | Krappel et al. ............. 307/10.1 |

(Continued)

FOREIGN PATENT DOCUMENTS

DE    100 00 500 A1    7/2001

(Continued)

OTHER PUBLICATIONS

International Search Report for PCT/FR2005/003113 dated Apr. 7, 2006, 3 pages.

(Continued)

*Primary Examiner* — Neil Abrams
(74) *Attorney, Agent, or Firm* — Foley & Lardner LLP

(57) ABSTRACT

An exemplary embodiment relates to a measuring device for measuring a current flowing in a first cable. The measuring device includes a measuring shunt in the form of a plate connected in series with the first cable and associated with a measuring electronic card connected to a data transmission cable. The measuring shunt further includes a measuring portion of resistive alloy coupled to connection portions on either side of the measuring portion. The connection portions are integrally formed with the measuring portion, and the first cable is secured to at least one of the connection portions of the measuring shunt.

4 Claims, 1 Drawing Sheet

U.S. PATENT DOCUMENTS

| | | | |
|---|---|---|---|
| 6,218,805 B1 | 4/2001 | Melcher | |
| 6,304,062 B1 | 10/2001 | Batson | |
| 6,347,958 B1 * | 2/2002 | Tsai | 439/488 |
| 6,515,468 B1 * | 2/2003 | Morimoto et al. | 324/117 H |
| 6,522,123 B2 | 2/2003 | Ribes | |
| 6,544,078 B2 * | 4/2003 | Palmisano et al. | 439/762 |
| 6,551,147 B2 * | 4/2003 | Wakata et al. | 439/754 |
| 6,719,595 B1 * | 4/2004 | Welcker | 439/883 |
| 6,787,935 B2 | 9/2004 | Heim | |
| 6,791,315 B2 * | 9/2004 | Skerritt et al. | 324/126 |
| 6,793,534 B2 * | 9/2004 | Cheng et al. | 439/620.04 |
| 6,808,841 B2 * | 10/2004 | Wakata et al. | 429/91 |
| 6,856,162 B1 * | 2/2005 | Greatorex et al. | 324/764.01 |
| 7,198,510 B2 * | 4/2007 | Bertness | 439/500 |
| 7,233,474 B2 * | 6/2007 | Brown et al. | 361/104 |
| 7,319,304 B2 * | 1/2008 | Veloo et al. | 320/134 |
| 7,344,420 B2 * | 3/2008 | Tokunaga | 439/754 |
| 7,381,101 B2 * | 6/2008 | Roset et al. | 439/754 |
| 7,385,828 B2 * | 6/2008 | Oman et al. | 361/763 |
| 7,405,570 B2 * | 7/2008 | Hirthammer | 324/426 |
| 7,456,616 B2 * | 11/2008 | Harmon et al. | 322/27 |
| 7,491,097 B2 * | 2/2009 | Ishihara et al. | 439/763 |
| 7,500,888 B2 * | 3/2009 | Roset et al. | 439/754 |
| 7,573,274 B2 * | 8/2009 | Aratani | 324/713 |
| 7,578,710 B2 * | 8/2009 | Koelle et al. | 439/762 |
| 7,663,376 B2 * | 2/2010 | Fernandez | 324/555 |
| 7,671,755 B2 * | 3/2010 | Dreiskemper et al. | 340/636.1 |
| 7,755,346 B2 * | 7/2010 | Tanizawa | 324/117 H |
| 2004/0155645 A1 | 8/2004 | Dragoi et al. | |
| 2009/0195252 A1 * | 8/2009 | Kerbel | 324/426 |
| 2010/0019733 A1 * | 1/2010 | Rubio | 320/136 |
| 2011/0062945 A1 * | 3/2011 | Condamin et al. | 324/126 |
| 2011/0076888 A1 * | 3/2011 | Fernandez et al. | 439/620.01 |

FOREIGN PATENT DOCUMENTS

EP            1 107 009 A1     6/2001

OTHER PUBLICATIONS

Written Opinion of the International Searching Authority for PCT/FR2005/003113 dated Apr. 19, 2006, 5 pages.

US Office Action received in U.S. Appl. No. 12/953,373, dated Mar. 10, 2011.

* cited by examiner

DEVICE FOR MEASURING A CURRENT FLOWING IN A CABLE

CROSS-REFERENCE TO RELATED PATENT APPLICATIONS

The present application is a continuation of U.S. application Ser. No. 11/793,440 filed Dec. 13, 2005, which is a is a National Stage of International Application No. PCT/FR2005/003113 filed on Dec. 20, 2004, which claims the benefit of French Patent Application No. 0413593, filed Dec. 20, 2004. The entire disclosure of International Application No. PCT/FR2005/003113 and French Patent Application No. 0413593 are incorporated herein by reference.

BACKGROUND

The present disclosure relates to a device for measuring a current flowing in a cable, and more particularly to a power supply cable connected to a battery.

Measuring devices for monitoring the load on a battery are generally known and might include a shunt in the form of a plate connected in series with the cable for powering various pieces of equipment connected to the battery, the measuring shunt being associated with a measuring electronic card connected to a measurement data transmission cable.

Various embodiments of the above-mentioned measurement device are known. In particular, EP 1,238,288 discloses a measuring device integrated in a battery cable terminal in which the measuring shunt comprises a measuring portion of resistive alloy associated with a measuring electronic card, and connected to conductive connection portions along two opposite edges of the measuring portion, the connection portions both being supported by the battery cable terminal. Such a measuring device is complex and difficult to make. Therefore, its cost is high compared to the cost generally accepted for equipment of that type.

Likewise, U.S. Pat. No. 6,304,062 (Batson) discloses a current measuring device comprising a shunt connected between the terminals of two adjacent battery cells. Such battery cells need to have a structure that is specifically adapted to receive the Batson current measuring device, which results in the battery not being freely interchangeable.

An object of the disclosure is to provide a current measuring device that is simple in structure thereby enabling it to be made at low cost.

SUMMARY

One exemplary embodiment relates to a measuring device for measuring a current flowing in a first cable. The measuring device includes a measuring shunt in the form of a plate connected in series with the first cable and associated with a measuring electronic card connected to a data transmission cable. The measuring shunt further includes a measuring portion of resistive alloy coupled to connection portions on either side of the measuring portion. The connection portions are integrally formed with the measuring portion, and the first cable is secured to at least one of the connection portions of the measuring shunt.

Another exemplary embodiment relates to a measuring shunt. The measuring shunt is for installation between a battery cable terminal and an end of a conductive cable and for monitoring a load on a battery. The measuring shunt includes a plate having a first connection portion and a second connection portion. The first connection portion is configured to connect to the end of the conductive cable. The second connection portion is configured to connect to the battery cable terminal. The measuring shunt further includes a measuring portion integrally formed from the plate and defined by an area between the first connection portion and the second connection portion. The measuring portion including studs that extend from the measuring shunt and are configured to be inserted into an electrical measuring circuit.

Another exemplary embodiment relates to a method of making a measuring device for measuring a current flowing in a cable. The method includes forming a measuring shunt from a resistive alloy, the measuring shunt comprising a measuring portion disposed between a first connection portion and a second connection portion. The method further includes coupling a conductive core of the cable to the first connection portion and coupling the second connection portion to a conductive material. The method yet further includes coupling a measuring electronic circuit to the measuring shunt, the measuring electronic circuit being coupled to a data transmission cable.

DETAILED DESCRIPTION

Referring generally to the Figures, a measuring device for measuring a current flowing in a cable includes a measuring shunt connected in series with the cable and associated with a measuring electronic card connected to a data transmission cable, the measuring shunt including a measuring portion of resistive alloy connected to connection portions made of resistive alloy and integrally formed with the measuring portion. The power supply cable has one end secured to one face of a connection portion of the measuring shunt. The measuring shunt can be made by forming a plate of resistive alloy. Fastening the shunt to the end of the cable may be done in an automated manner.

Referring further to the Figures, the connection portion remote from the end of the cable is secured directly to a battery cable terminal by welding, preferably to a conductive tab that is integral with the terminal. This makes it possible likewise to automate securing the shunt to the terminal and the resulting connection is very strong, thus enabling the measuring device to be cantilevered out from the terminal without damaging the device.

Other objects, features, and advantages of the present invention will become apparent to those skilled in the art from the following detailed description and accompanying drawings. It should be understood, however, that the detailed description and specific examples, while indicating preferred embodiments of the present invention, are given by way of illustration and not limitation. Many modifications and changes are within the scope of the present invention may be made without departing from the spirit thereof, and the invention includes all such modifications.

Figure 1:
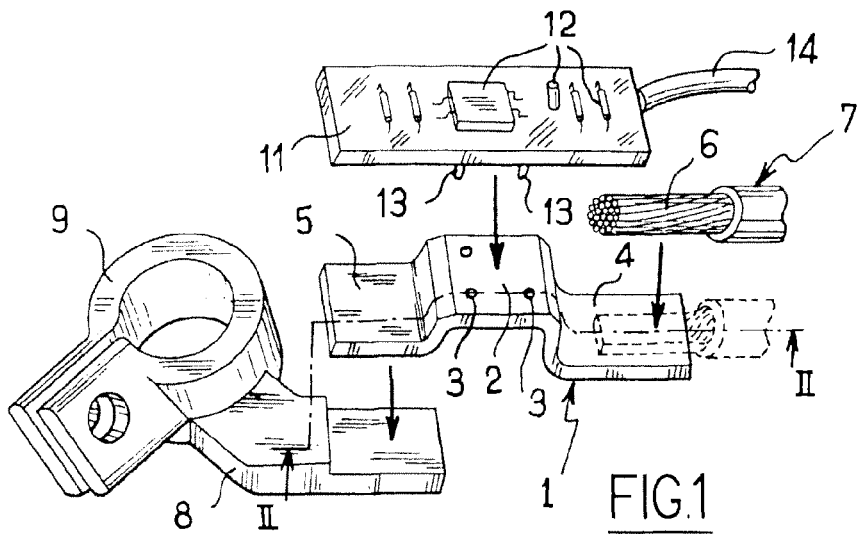
FIG. 1 is an exploded perspective view of a measuring device according to one embodiment.
Figure 2:
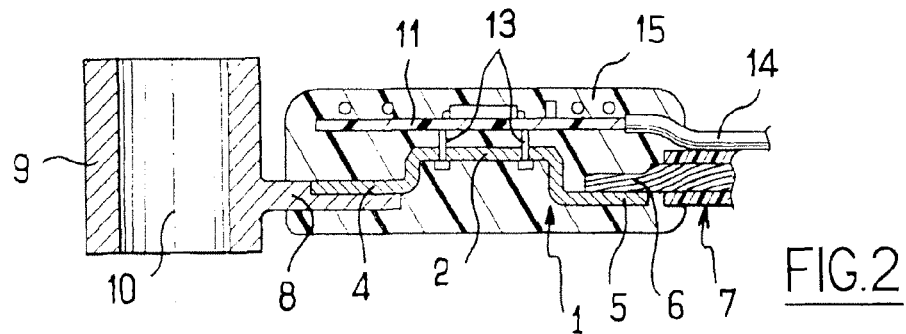
FIG. 2 is a section view on line II-II of FIG. 1 showing the measuring device once assembled.

Referring now to FIGS. 1 and 2, according to one embodiment, a measuring device comprises a measuring shunt 1, made from a single piece of resistive alloy, such as manganin, and including a central portion defined by holes 3 for forming a measuring portion 2 of measuring shunt L On either side of measuring portion 2, measuring shunt 1 has connection portions 4 and 5, which in this embodiment extend parallel to measuring portion 2, and are offset therefrom.

Connection portion 4 is secured to an end 6 of a conductive core of a cable 7 used for powering equipment. In a preferred embodiment, the end 6, which is initially in the form of a bundle of conductor wires, is pressed against one face of connection portion 4 and is heated (e.g. by ultrasound) so as to melt the bundle of conductor wires thereby perform autogenous welding, as represented by dashed lines in FIG. 1.

Connection portion 5 is secured in the same manner (i.e. by autogenous welding) to the face of a support tab 8, which is made of conductive material, such as brass. Support tab 8 is made integrally with a battery cable terminal 9. In one embodiment, support tab 8 extends perpendicularly to axis 10 of battery cable terminal 9 in the vicinity of the base.

The measuring device also includes an electronic card 11 having components 12 which form a measuring circuit. Electronic card 11 is coupled to measuring shunt 1 by inserting connection pins 13 into holes 3 during assembly and soldering connection pins 13 therein in order to measure a potential difference across the ends of measuring portion 2 of measuring shunt 1. Electronic card 11 is also coupled to a data transmission cable 14.

Referring now to FIG. 2, after the measuring device components have been assembled together as described above, a block of resin 15 is molded around the measuring device so as to finish off the mechanical connection between cable 7 and support tab 8 of battery cable terminal 9 in such a manner that the measuring device is cantilevered out from battery cable terminal 9. It should be observed that given the disposition of the various components making up the measuring device, the total thickness of resin block 15 is less than that of battery cable terminal 9.

Figure 3:
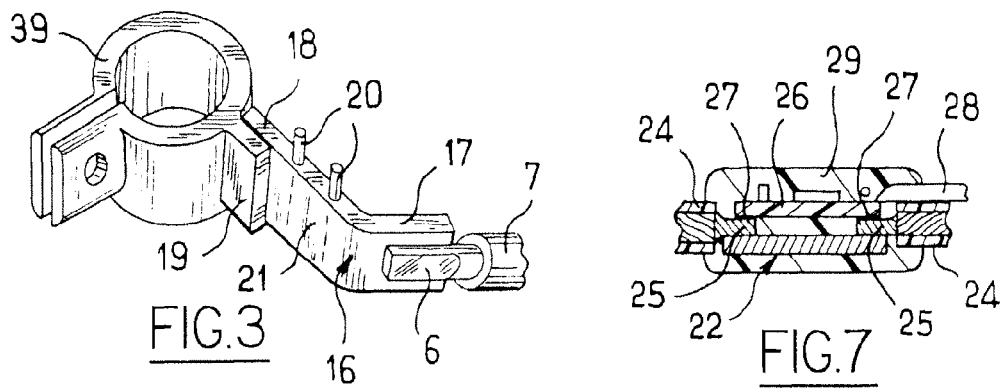
FIG. 3 is a perspective view of a measuring shunt and of its connections according to another embodiment.

Referring now to FIG. 3, another embodiment is shown in which measuring shunt 16 is in the form of a bent plate having a connection portion 17 with a face on which an end 6 of a conductive core of a cable 7 is secured, while a connection portion 18 remote from end 6 of cable 7 is secured to a connection tab 19 extending parallel to the axis of a battery cable terminal 39. In this embodiment, measuring shunt 16 has studs 20 that extend from the top edge of measuring shunt 16 to define a measuring portion 21. Under such circumstances, an electronic card (not shown) is preferably mounted perpendicular to measuring shunt 16, by inserting studs 20 into holes in an electrical circuit carried by an electronic card.

Figure 4:
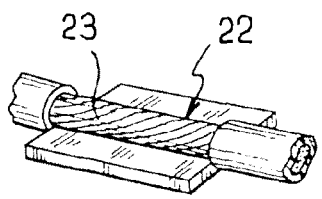
FIGS. 4-6 show various steps in making the shunt and its connections according to another embodiment.
Figure 5:
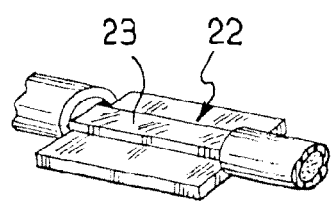
Figure 6:
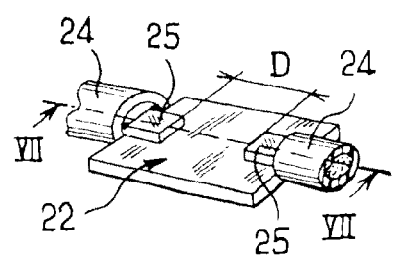

Referring now to FIGS. 4-6, various steps in making a measuring device are shown according to one embodiment. In this embodiment, the measuring shunt is in the form of a rectangular plane plate 22. The cable is stripped over a length that is slightly greater than the length of rectangular plate 22 so as to reveal its conductive core 23 which is pressed against one of the faces of rectangular plate 22 and autogenously welded thereto by melting the conductor wires making up conductive core 23. In the stripped portion, conductive core 23 is thus in the form of a bar secured to the corresponding face of rectangular plate 22 as shown in FIG. 5. As shown in FIG. 6, conductive core 23 is then machined (e.g. by milling) in order to eliminate the central portion of conductive core 23 so that at the end of this operation, the measuring shunt is secured to the ends of two cable segments 24 with their conducive ends 25 being spaced apart by a distance D that defines the measuring portion of measuring shunt.

Figure 7:
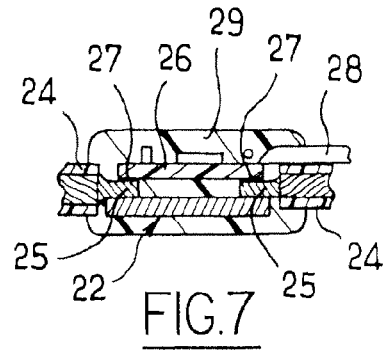
FIG. 7 is a section view on line VII-VII of FIG. 6 showing the shunt and its connections once assembled.

Referring now to FIG. 7, an electronic card 26 having circuit contacts 27 on its bottom face is secured to conductive ends 25 of cable segments 24 in order to pick up a potential difference between conducive ends 25. As before, electronic card 26 is connected to a data transmission cable 28 and the assembly is embedded in a resin block 29.

The present invention is not limited to the embodiments described and variants can be applied thereto without departing from the spirit of the invention as defined by the claims.

In particular, the invention is not restricted to the embodiments shown of the measuring shunt in which one of the connection portions is suitable for securing directly to the side wall or to the end edge of a battery cable terminal of conventional structure.

What is claimed is:

1. A method of making a measuring device for measuring a current flowing in a cable connected to a battery, the method comprising:

forming a measuring shunt from a resistive alloy, the measuring shunt comprising holes defining a measuring portion disposed between a first connection portion and a second connection portion;

coupling a conductive core of the cable to the first connection portion by autogenous welding;

coupling the second connection portion by autogenous welding to a conductive tab integral with a battery cable terminal, wherein the conductive tab extends perpendicular to an axis of the battery cable terminal and includes a total thickness less than the thickness of the battery cable terminal; and coupling a measuring electronic circuit to the measuring shunt by engaging connection pins of the electronic control circuit into the holes of the measuring shunt, the measuring electronic circuit being coupled to a data transmission cable.

2. The method of claim 1, further comprising the step of coating the measuring shunt with a resin.

3. The method of claim 1, wherein the measuring shunt is in the form of a plate and made of a single piece of resistive alloy.

4. The method of claim 2, wherein the resin is molded around the measuring device, a portion of the cable, and a portion of the conductive material coupled to the second connection portion to strengthen a mechanical connection between the cable, the measuring shunt, and the conductive material.

* * * * *